(12) United States Patent
Hattori et al.

(10) Patent No.: US 7,871,755 B2
(45) Date of Patent: Jan. 18, 2011

(54) PHOTOSENSITIVE COMPOSITION

(75) Inventors: Shigeki Hattori, Kawasaki (JP); Satoshi Saito, Yamato (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 358 days.

(21) Appl. No.: 12/194,204

(22) Filed: Aug. 19, 2008

(65) Prior Publication Data

US 2009/0081582 A1   Mar. 26, 2009

(30) Foreign Application Priority Data

Sep. 25, 2007  (JP) ............................. 2007-248023

(51) Int. Cl.
G03F 7/004 (2006.01)
G03F 7/30 (2006.01)

(52) U.S. Cl. .................... 430/270.1; 430/325; 430/326; 430/330

(58) Field of Classification Search ............. 430/270.1, 430/325, 326, 330
See application file for complete search history.

(56) References Cited

U.S. PATENT DOCUMENTS

| 6,197,473 | B1 | 3/2001 | Kihara et al. ................ 430/192 |
| 7,214,554 | B2 | 5/2007 | Winters et al. ................ 438/21 |
| 7,338,755 | B2 | 3/2008 | Saito ........................... 430/326 |
| 2007/0059632 | A1* | 3/2007 | Oguro et al. ............. 430/270.1 |
| 2007/0224550 | A1 | 9/2007 | Saito ........................... 430/330 |
| 2007/0238050 | A1 | 10/2007 | Saito ........................ 430/270.1 |

FOREIGN PATENT DOCUMENTS

JP      2003-183227      7/2003

OTHER PUBLICATIONS

Morikawa, et al., "Preparation of Poly[(ether)-(ether ether ketone)]Dendrimers by the Convergent Method", Polymer Journal, vol. 32, No. 3, pp. 255-262, 2000.

Kadota, et al., "Novel Electron-Beam Molecular Resists with High Resolution and High Sensitivity for Nanometer Lithography", The Chemical Society of Japan, Chemistry letters, vol. 33, No. 6, 2004, pp. 706-707.

* cited by examiner

*Primary Examiner*—John S Chu
(74) *Attorney, Agent, or Firm*—Ohlandt, Greeley, Ruggiero & Perle, L.L.P.

(57) ABSTRACT

A photosensitive composition is provided, which includes a compound represented by the formula BP; and a photo-acid generator which generates an acid by the action of actinic radiation, formula BP

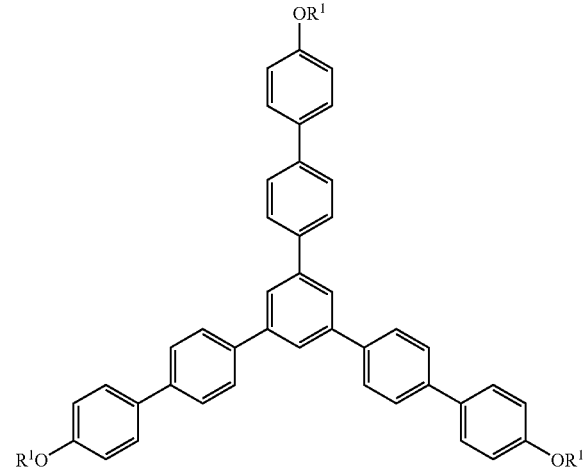

wherein $R^1$ is an acid-leaving group, and a part of $R^1$ may be substituted with a hydrogen atom.

20 Claims, No Drawings

PHOTOSENSITIVE COMPOSITION

CROSS-REFERENCE TO RELATED APPLICATIONS

This application is based upon and claims the benefit of priority from prior Japanese Patent Application No. 2007-248023, filed Sep. 25, 2007, the entire contents of which are incorporated herein by reference.

BACKGROUND OF THE INVENTION

1. Field of the Invention

The present invention relates to a photosensitive composition used in microfabrication in a process for producing semiconductor elements, etc. and a method for forming a pattern with the same.

2. Description of the Related Art

In experimental manufacture of microwave elements and quantum-effect devices, characteristics of fine patterning of 100 nm or less are required. However, since edge roughness, etc. is affected by the molecular size of the polymer compound used, such influence is becoming problematic. It is therefore increasingly difficult to further improve the resolution of a resist based on the polymer compound.

To achieve a high resolution, an EB resist using a cyclic phenol derivative is also under study, but an EB resist having sufficient sensitivity in addition to high resolution and being developable with an alkali aqueous solution is still not obtained.

JP-A 2003-183227 (KOKAI) proposes a positive tone resist using a phenol derivative composed of 10 benzene rings. Such resists are developable with an alkali aqueous solution, but even if these resists are used, pattern formation is not always satisfactory, and the adhesiveness thereof to a substrate is not referred to. In addition, the proposed resist is hardly synthesized and fails to achieve sufficient sensitivity.

On the other hand, Polymer Journal 32(3), 255-262 (2000) proposes a compound having benzene rings linked to one another in 3 directions around one benzene ring. Such compound is used as a synthetic intermediate compound and has been used in synthesis of dendrimers regarded useful in a drug delivery system and the like.

BRIEF SUMMARY OF THE INVENTION

A photosensitive composition according to one aspect of the present invention comprises:
a compound represented by formula BP;

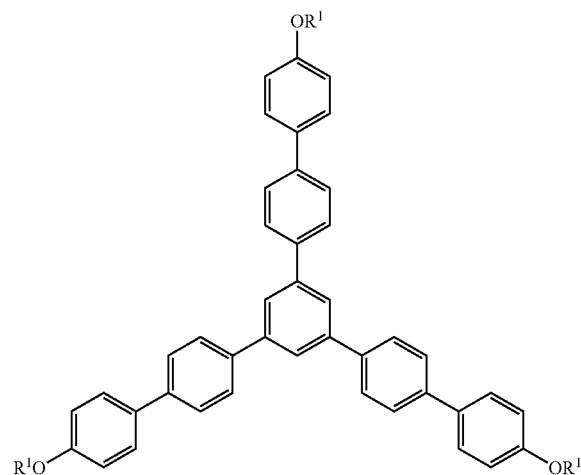

formula (BP)

wherein $R^1$ is an acid-leaving group, and a part of $R^1$ may be substituted with a hydrogen atom; and
a photo-acid generator which generates an acid by an action of actinic radiation.

A photosensitive composition according to another aspect of the present invention comprises:
a compound represented by the formula BN;

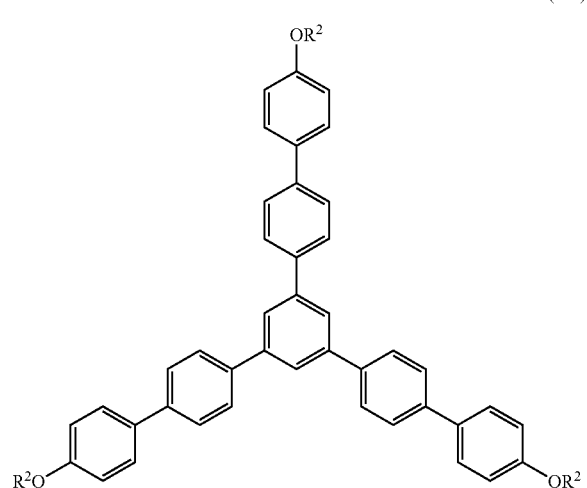

formula (BN)

wherein $R^2$ is a hydrogen atom, and a part of $R^2$ may be substituted with an acid-leaving group;
a photo-acid generator which generates an acid by an action of actinic radiation; and
a crosslinker which reacts with a hydroxy group by a catalytic reaction of an acid.

A method for forming a pattern according to one aspect of the present invention comprises:
forming a photosensitive layer containing the aforementioned photosensitive composition above a substrate;
subjecting a predetermined region of the photosensitive layer to pattern exposure by irradiation with actinic radiation;
subjecting the substrate to a baking treatment; and
subjecting the photosensitive layer after the baking treatment to development treatment with an alkali aqueous solution, to selectively remove the light-exposed portion or the light-unexposed portion of the photosensitive layer.

DETAILED DESCRIPTION OF THE INVENTION

Hereinafter, embodiments will be described in detail.

The photosensitive composition in one embodiment contains a compound represented by the general formula (BP) above and a photo-acid generator that generates an acid by the action of actinic radiation. When a predetermined region of a photosensitive layer containing the photosensitive composition is irradiated with actinic radiation, an acid is generated selectively in the light-exposed portion by a photo-acid generator. In the general formula (BP), an acid-leaving group is introduced as $R^1$, and this acid-leaving group is decomposed with the acid. As a result, the light-exposed portion of the photosensitive layer has increased solubility in an alkali aqueous solution and can be dissolved and removed selectively with an alkali developing solution. That is, the photosensitive composition forms a positive tone chemically amplified resist.

The compound represented by the general formula (BP) above is incorporated as a matrix compound into the photosensitive composition. Such compound is a low-molecular-weight compound composed of 7 benzenes connected to one another and extending in 3 directions from a central benzene ring. The low-molecular-weight compound generally shows crystallinity without showing an amorphous property. Nevertheless, it was found by the present inventors that this compound specifically shows an amorphous property and has preferable characteristics as a matrix compound.

In addition, the compound represented by the general formula (BP) has a lower steric hindrance among its molecules, and thus its individual molecules upon forming a solid aggregate do not generate excess gaps thereamong. Accordingly, the molecules in the aggregate are estimated to hardly move, thus making their glass transition point high. Further, the compound has another benzene ring at the para-position of each of benzene rings extending in 3 directions from the central benzene ring, thus allowing the benzene rings to easily give rise to a resonance effect. In addition, each of the terminal benzene rings has ($-$OR$^1$) at its para-position to further increase the resonance effect. It is believed that when a hydrogen atom is introduced as R$^1$, that is, when a hydroxy group ($-$OH) is bound to the benzene ring, the hydroxy group easily forms ($-$O$^-$) by eliminating its hydrogen atom.

The hydrogen atom is easily eliminated upon irradiation particularly with ionizing radiation such as actinic radiation, and the eliminated hydrogen atom is estimated to promote the generation of an acid from a photo-acid generator that was incorporated into the composition (for example, J. Vac. Sci. Technol. B 15, 2582 (1997)). This promotion in acid generation leads to generation of a larger amount of acids than usual, thus allowing the same amount of acids to be generated by irradiation with a lower dose of actinic radiation. As a result, the sensitivity of the composition as a positive tone chemically amplified resist is significantly improved.

The photosensitive composition in one embodiment contains a low-molecular-weight compound having a low molecular size as the matrix compound, and is thus is composed of the low-molecular-weight compounds only. As a result, the resulting resist can increase the resolution and simultaneously reduce the edge roughness.

For example, a high-molecular-weight compound has a large molecular size, thus forming a large-sized aggregate with a network structure of entangled molecular chains. In the case of a photosensitive composition containing such a high-molecular-weight compound as the matrix compound, large aggregates are eliminated in a light-exposed portion during development, to cause large edge roughness in a sidewall.

On the other hand, the low-molecular-weight compound has a small molecular size, thus forming a small-sized aggregate of entangled molecular chains. It follows that in the case of a photosensitive composition composed exclusively of low-molecular-weight compounds, small aggregates are eliminated in a light-exposed portion during development, to reduce edge roughness in a sidewall. As a result, the photosensitive composition in the embodiment using the low-molecular-weight compound can increase the resolution and reduce edge roughness.

A structure having a plurality of benzene rings linked to one another around one benzene ring cannot achieve a very high sensitivity unless it is at the para-position that one benzene ring is bound to another benzene ring. Unless it is at the para-position that one benzene ring is bound to another benzene ring, the glass transition point cannot be increased, thus permitting an acid to be easily diffused and presumably leading to an increase in roughness. Such a structure is, for example, the following conventional structure:

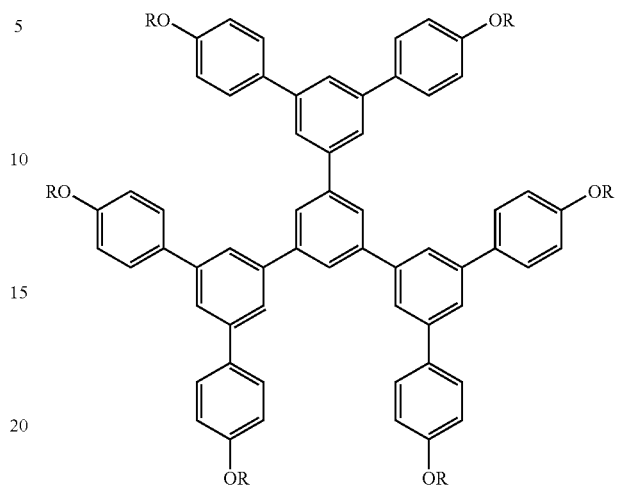

wherein R is an acid-leaving group.

In such a structure, each of the benzene rings extending in 3 directions from the central benzene ring has another benzene ring at the meta-position, thus reducing the resonance effect among the benzene rings. The terminal benzene ring has ($-$OR) at the para-position, but when a hydrogen atom is introduced as R, the hydrogen atom is hard to eliminate. That is, ($-$O$^-$) is estimated to be hardly generated, and consequently, sensitivity cannot be increased, resulting in low sensitivity. In addition, this molecular structure has many branched chains that inevitably increase the steric hindrance among the molecules. When the molecules form a solid aggregate, the individual molecules are estimated to easily form excessive gaps through which the molecules can easily move, thus making the glass transition point lower.

As described above, the compound of such a conventional structure is low in sensitivity and also low in glass transition point, and therefore, a photosensitive composition containing the compound as a matrix compound cannot reduce the edge roughness caused by excessive acid diffusion.

The photosensitive composition in one embodiment contains the compound of the specific structure and can thus increase the resolution, can reduce edge roughness and can realize ultrahigh sensitivity.

In the compound represented by the general formula (BP), an acid-leaving group is introduced into R$^1$ in ($-$OR$^1$) bound at the para-position to each of the terminal benzene rings. The acid-leaving group includes, for example, an ether, an ester, an alkoxy carbonate, a silyl ether, an acetal, a ketal, a cyclic orthoester, a silylketene acetal, a cyclic acetal, a cyclic ketal and a cyanohydrin.

Specific examples of the ether include t-butoxycarbonyl ether, t-butoxymethyl ether, 4-pentenyloxymethyl ether, tetrahydropyranyl ether, tetrahydrothiopyranyl ether, 3-bromotetrahydropyranyl ether, 1-methoxycyclohexyl ether, 4-methoxytetrahydropyranyl ether, 4-methoxytetrahydrothiopyranyl ether, 1,4-dioxan-2-yl ether, tetrahydrofuranyl ether, tetrahydrothiofuranyl ether, 2,3,3a,4,5,6,7,7a-octahydro-7,8,8-trimethyl-4,7-methanobenzofuran-2-yl ether, t-butyl ether, trimethylsilyl ether, triethylsilyl ether, triisopropylsilyl ether, dimethylisopropylsilyl ether, diethylisopropylsilyl ether, dimethylthexylsilyl ether, and t-butyldimethylsilyl ether.

Specific examples of the ester include t-butyl ester, ethyl ester, methyl ester, benzyl ester, isopropyl ester, tetrahydropyranyl ester, tetrahydrofuranyl ester, methoxyethoxymethyl ester, 2-trimethylsilylethoxymethyl ester, 3-oxocyclohexyl ester, isobornyl ester, trimethylsilyl ester, triethylsilyl ester, isopropyldimethylsilyl ester, di-t-butylmethylsilyl ester, oxazole, 3-alkyl-1,3-oxazoline, 4-alkyl-5-oxo-1,3-oxazoline and 5-alkyl-4-oxo-1,3-dioxolane.

Specific examples of the alkoxy carbonate include t-butoxy carbonate, methoxy carbonate and ethoxy carbonate.

Specific examples of the silyl ether include trimethylsilyl ether, triethylsilyl ether, di-t-butylsilyl ether, 1,3,1',1',3',3'-tetraisopropyldisiloxanylidene ether and tetra-t-butoxydisiloxane-1,3-diylidene ether.

Specific examples of the acetal include methylene acetal, ethylidene acetal, 2,2,2-trichloroethylidene acetal, adamantyloxyethyl, adamantylmethoxyethyl, adamantylethoxyethyl, and bicyclononane-3,7-carbolactyloxyethyl.

Specific examples of the ketal include 1-t-butylethylidene ketal, isopropylidene ketal (acetonide), cyclopenthylidene ketal, cyclohexylidene ketal, and cycloheptylidene ketal.

Specific examples of the cyclic orthoester include methoxymethylene acetal, ethoxymethylene acetal, dimethoxymethylene orthoester, 1-methoxyethylidene orthoester, 1-ethoxyethylidene orthoester, 1,2-dimethoxyethylidene orthoester, 1-N,N-dimethylaminoethylidene orthoester and 2-oxacyclopentylidene orthoester.

Specific examples of the silylketene acetal include trimethylsilylketene acetal, triethylsilylketene acetal and t-butyldimethylsilylketene acetal.

Specific examples of the cyclic acetal and cyclic ketal include 1,3-dioxane, 5-methylene-1,3-dioxane, 5,5-dibromo-1,3-dioxane, 1,3-dioxolane, 4-bromomethyl-1,3-dioxolane, 4,3'-butenyl-1,3-dioxolane and 4,5-dimethoxymethyl-1,3-dioxolane.

Specific examples of the cyanohydrin include O-trimethylsilyl cyanohydrin, O-1-ethoxyethyl cyanohydrin, and O-tetrahydropyranyl cyanohydrin.

As the acid-leaving group, the acetal is preferable because its bond cleavage energy is minimum in the catalytic reaction with an acid generated from the photo-acid generator so that the elimination reaction of a protective group easily occurs to improve sensitivity.

Preferably, the acid-leaving group contains an alicyclic structure. In the case of irradiation with actinic radiation under vacuum, there is a problem that a degasifying gas is generated to foul the inside of an irradiation device, but this problem can be solved by the alicyclic structure. Specifically, the alicyclic structure generally has a high boiling point of 200° C. or more, so there can be brought about an effect of suppressing generation of its degasifying gas. The alicyclic structure is not particularly limited, and particularly adamantane and hyperlactone are preferable.

Adamantane has strong hydrophobicity and can thus show a high inhibitory effect on a developing solution with a low ratio of protection, to leave many hydroxy groups. Consequently, adamantane is advantageous in that adhesiveness to a silicon substrate can be kept high, while contrast can be increased. On the other hand, hyperlactone has hydrophilicity and, contrarily to adamantane, allows the surface energy of a resist film to be kept high even at a high ratio of protection. That is, adhesiveness to a silicon substrate, etc. can be increased, while high contrast is maintained. As just described, both adamantane and hyperlactone contribute to improvements in contrast.

In consideration of the foregoing, the acid-leaving group is preferably any one of the following structures:

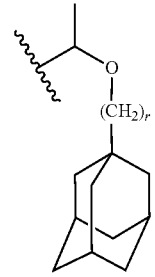

(AC-1)

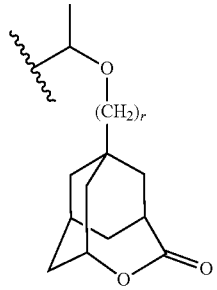

(AC-2)

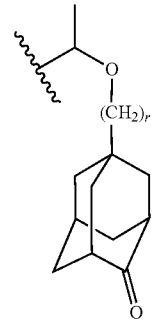

(AC-3)

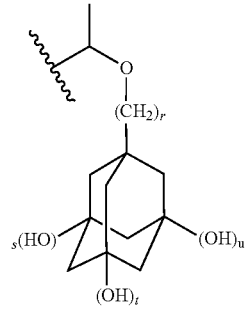

(AC-4)

wherein r is an integer of 0 to 5, and s, t and u may be the same or different and each represent an integer of 0 or 1 provided that the total of s, t and u is an integer of 1 to 3.

Specific examples of the structures include those represented by the following (AC-5), (AC-6), (AC-7) and (AC-8):

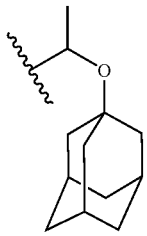

(AC-5)

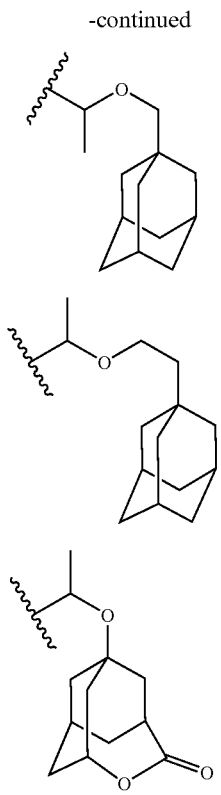
(AC-6)

(AC-7)

(AC-8)

Because the acid-leaving group described above has been introduced into $R^1$ the compound represented by the general formula (BP) has a positive tone property of dissolving in a developing solution upon exposure to light. A part of $R^1$ may be replaced by a hydrogen atom. In this case, the adhesiveness to a substrate can be increased.

When 5 to 95% of $R^1$ is occupied by hydrogen atoms, the effect described above can generally be attained, though this depends on the type of the acid-leaving group. Specifically, when the acid-leaving group is a highly hydrophobic substituent such as the one represented by the general formula (AC-5), (AC-6) or (AC-7), its hydrogen atom content is preferably about 60 to 95%. When the acid-leaving group $R^1$ is a highly hydrophilic substituent such as the one represented by the general formula (AC-8), its hydrogen atom content is preferably about 20 to 80%. The ratio of substitution may be suitably selected depending on the type of the acid-leaving group.

The compound represented by the general formula (BP) is incorporated as a matrix compound into the photosensitive composition in one embodiment. If necessary, two or more matrix compounds may be contained in the composition.

Degradation of the acid-degradative group is caused by an acid generated from a photo-acid generator. The photo-acid generator is a compound that generates an acid by the action of actinic radiation. The actinic radiation refers specifically to ultraviolet light and ionizing radiation, and the photo-acid generator that can be preferably used includes sulfonyl salt compounds, iodonium salt compounds, other onium salt compounds, and sulfonyl esters. Preferable examples of the photo-acid generator can include:

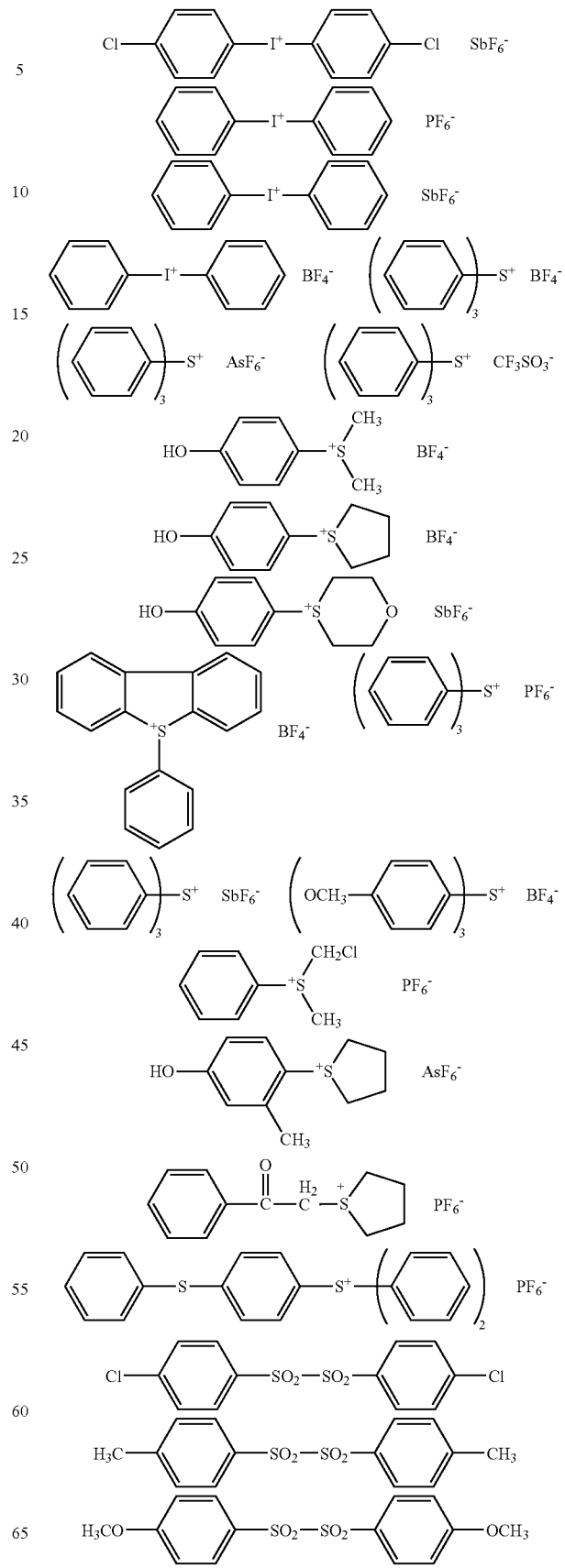

-continued
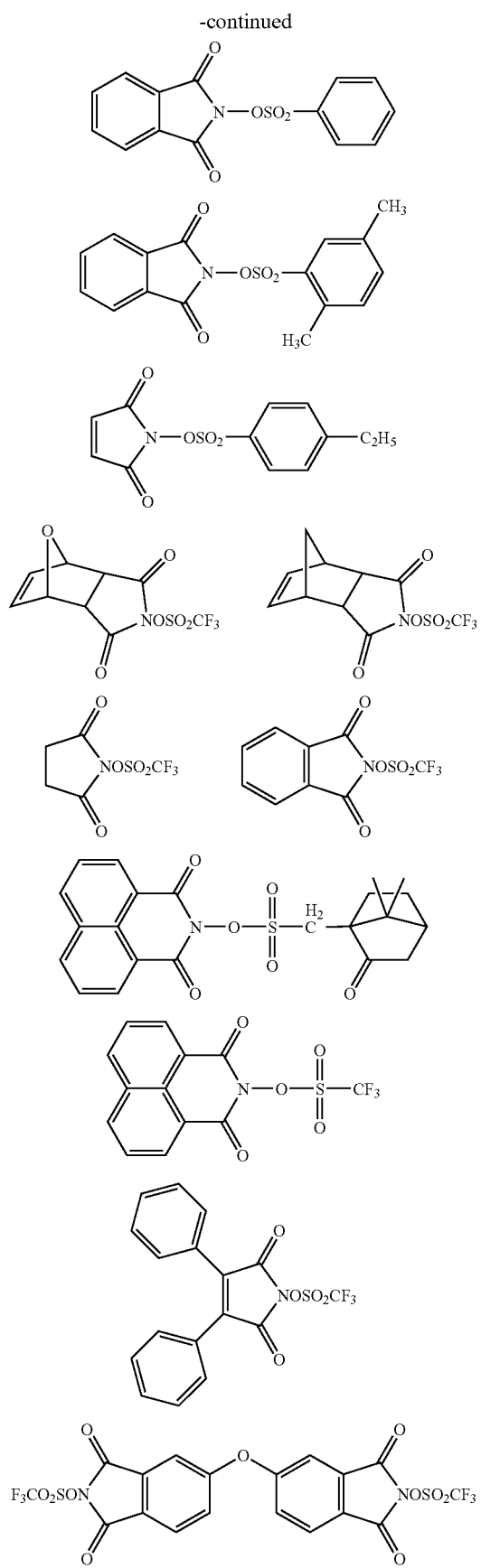
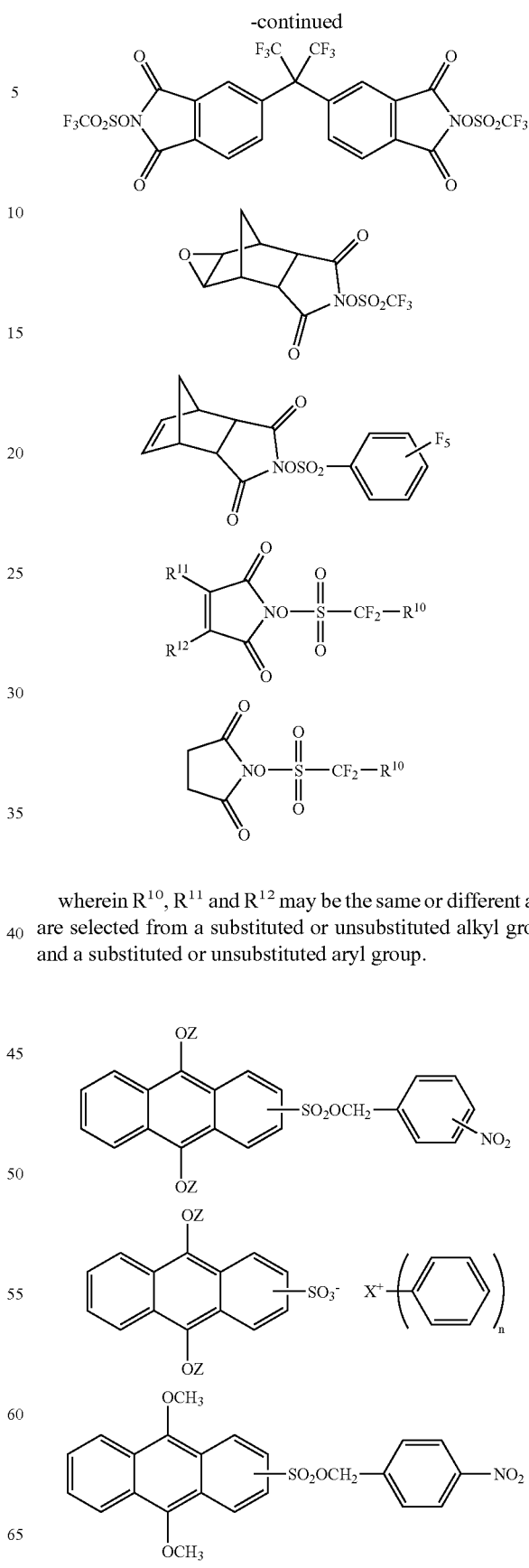
wherein $R^{10}$, $R^{11}$ and $R^{12}$ may be the same or different and are selected from a substituted or unsubstituted alkyl group and a substituted or unsubstituted aryl group.

-continued

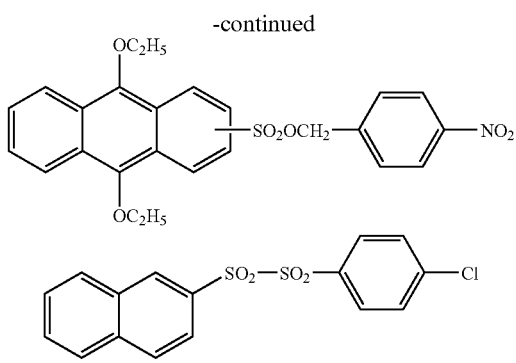

wherein Z is a substituent selected from a substituted or unsubstituted alkyl group, a substituted or unsubstituted alkoxy group, a substituted or unsubstituted aryl group, and a halogen atom; $X^+$- is an arbitrary cation group; and n is such an integer of 1 to 3 as to allow the total charge of the cation group to be +1.

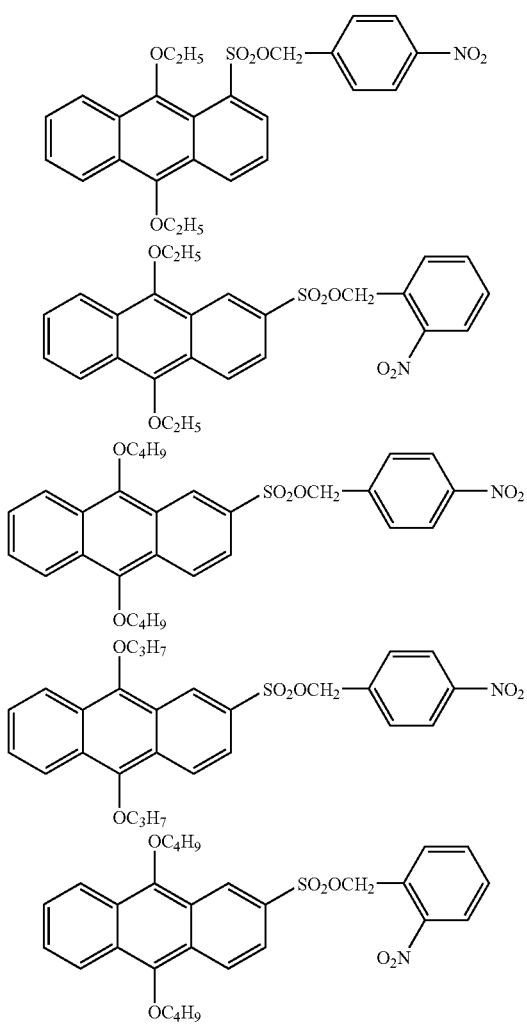

The photo-acid generators may be used singly or as a mixture of two or more thereof. Generally, the content of the photo-acid generator can be 0.1 to 10.0% by weight based on the total weight of solid components contained in the photosensitive composition. The solid components refer to those components in the photosensitive composition from which an organic solvent component was removed. When the content of the photo-acid generator is too low, sufficient sensitivity is hardly obtainable. Particularly, in irradiation with ionizing radiation, the photo-acid generator is required in a larger amount than in irradiation with ultraviolet light. On the other hand, when the content of the photo-acid generator is too high, the light transmittance of the photosensitive composition at the wavelength of exposure light may be deteriorated due to the light absorbance of the photo-acid generator itself when exposed, for example, to an ArF excimer laser. The photo-acid generator is incorporated more preferably in an amount of 0.3 to 5.0% by weight based on the solid components.

The positive tone photosensitive composition in one embodiment may be compounded if necessary with additives, as will be described in detail.

Now, the photosensitive composition in another embodiment is described in detail. The photosensitive composition in another embodiment contains a compound represented by the general formula (BN) below, a photo-acid generator that generates an acid by the action of actinic radiation, and a crosslinker that reacts with a hydroxy group by the catalytic action of an acid.

formula (BN)

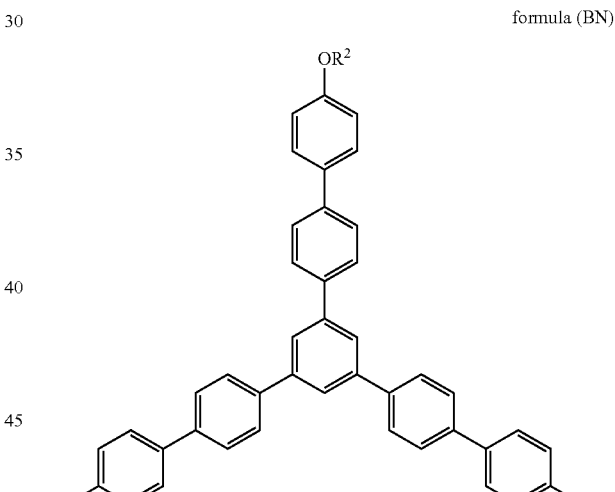

wherein $R^2$ is a hydrogen atom, and a part of $R^2$ may be substituted with an acid-leaving group.

When a predetermined region of a photosensitive layer containing the photosensitive composition is radiated with actinic radiation, an acid is generated selectively in the light-exposed portion by a photo-acid generator. The acid reacts with a hydroxy group of a crosslinker, to cause a dehydration reaction thereby forming a carbocation at the terminus of the crosslinker, and the carbocation then withdraws a hydrogen atom introduced as $R^2$ in the general formula (BN), to cause a crosslinking reaction. As a result, the light-exposed portion of the photosensitive layer undergoes the crosslinking reaction to decrease its solubility in an alkali aqueous solution, and thus a light-unexposed portion of the photosensitive layer can be removed selectively with an alkali developing solution. That is, the photosensitive composition forms a negative type chemically amplified resist.

The compound represented by the general formula (BN) above is incorporated as a matrix compound into the photosensitive composition. Such compound is a low-molecular-weight compound composed of 7 benzenes connected to one another in 3 directions extending continuously from the central benzene ring. As described above, the low-molecular-weight compound generally shows crystallinity without showing an amorphous property. Nevertheless, it was found by the present inventors that this compound, similar to the compound represented by the general formula (BP), shows an amorphous property specifically and has preferable characteristics as a matrix compound.

In addition, the compound represented by the general formula (BN) has lower steric hindrance among its molecules, and thus its individual molecules upon forming a solid aggregate hardly generate excess gaps thereamong. Accordingly, the molecules in the aggregate are estimated to hardly move, thus making their glass transition point high. Further, the compound has another benzene ring at the para-position of each of the benzene rings extending in 3 directions from the central benzene ring, thus allowing the benzene rings to easily give rise to a resonance effect. In addition, each of the terminal benzene rings has (—$OR^2$) at its para-position to further increase the resonance effect. It is believed that when a hydrogen atom is introduced as $R^2$, that is, when a hydroxy group (—OH) is bound to the benzene ring, the hydroxy group easily forms (—$O^-$) by eliminating its hydrogen atom.

The hydrogen atom is easily eliminated upon irradiation, particularly by ionizing radiation such as actinic radiation, and the eliminated hydrogen atom is estimated to promote the generation of an acid from a photo-acid generator that was incorporated into the composition, as described above. This promotion in acid generation leads to generation of a larger amount of acids than usual, thus allowing the same amount of acids to be generated by irradiation with a lower quantity of actinic radiation. As a result, the sensitivity of the composition as a negative type chemically amplified resist is significantly improved. When the benzene ring has a hydroxy group (—OH), its hydrogen is estimated to be easily eliminated also in the hydrogen-withdrawing reaction of a carbocation of the crosslinker, thus improving sensitivity.

The photosensitive composition containing the compound represented by the chemical formula (BN) in another embodiment is provided with all of these conditions, and can thus increase the resolution and simultaneously reduce the edge roughness.

Like the positive tone composition described above, the negative type photosensitive composition, when containing a high-molecular-weight compound as a matrix compound, will eliminate large aggregates in a light-unexposed portion during development. These large aggregates generate edge roughness on a sidewall. On the other hand, when the photosensitive composition composed exclusively of low-molecular-weight compounds is used, the molecular size is small and the size of an aggregate of entangled molecular chains is also small. Accordingly, small aggregates are eliminated on a light-unexposed portion during development, thus reducing edge roughness on a sidewall. As a result, the resolution can be increased, and simultaneously edge roughness can be reduced.

As described above, even a structure having a plurality of benzene rings linked to one another around one benzene ring cannot achieve very high sensitivity unless it is at the para-position that one benzene ring is bound to another benzene ring. Unless it is at the para-position that one benzene ring is bound to another benzene ring, the glass transition point is decreased, thus permitting an acid to be easily diffused, which leads presumably to an increase in roughness.

The photosensitive composition in another embodiment contains the compound having a specific structure, and can thus improve the resolution, can reduce edge roughness and can simultaneously realize ultrahigh sensitivity.

In the compound represented by the general formula (BN), a hydrogen atom is introduced into $R^2$ in (—$OR^2$) bound at the para-position to each terminal benzene ring, but a part of $R^2$ may be substituted with an acid-leaving group, as described above. Due to the presence of the acid-leaving group, the dissolution rate of the light-exposed portion to that of the light-unexposed portion, that is, the dissolution contrast can be regulated. The surface energy can also be regulated, thus increasing adhesiveness to various substrates.

When 70 to 99% of $R^2$ is occupied by hydrogen atoms, the effect described above can be attained generally, though depending on the type of the acid-leaving group. Specifically, when the acid-leaving group is a highly hydrophobic substituent such as the one represented by the general formula (AC-5), (AC-6) or (AC-7), its hydrogen atom content is preferably about 80 to 99%. When the acid-leaving group is a highly hydrophilic substituent such as the one represented by the general formula (AC-8), its hydrogen atom content is preferably about 70 to 95%. The ratio of substitution may be suitably selected depending on the type of the acid-leaving group.

A substituent group previously described may be introduced as the acid-leaving group. For the same reason as described above, the acid-leaving group is preferably a structure represented by the above-mentioned (AC-1), (AC-2), (AC-3) or (AC-4). The acid-leaving group is particularly preferably a structure represented by the above-mentioned (AC-5), (AC-6), (AC-7) or (AC-8).

A negative type photosensitive composition is obtained by incorporating a photo-acid generator and a crosslinker into the compound represented by the general formula (BN). As the photo-acid generator, the same compound as in the positive tone composition can be used. The compound represented by the general formula (BN) is incorporated as a matrix compound into the photosensitive composition in another embodiment. If necessary, two or more matrix compounds may be contained in the composition.

The crosslinker used may be an arbitrary compound having a group reacting with a hydroxy group by the catalytic action of an acid. Specific examples of the crosslinker include the following compounds:

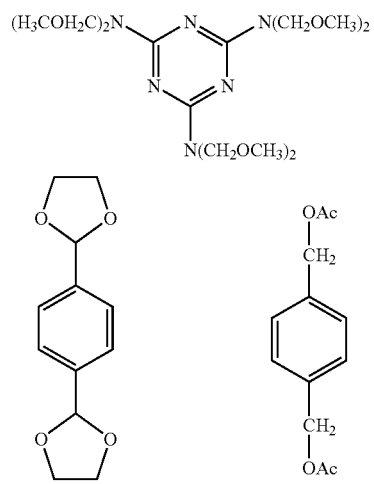

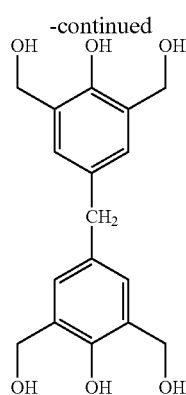

The content of the crosslinker can be suitably selected depending on the type of the crosslinker, etc., but is usually in the range of about 10 to 50% by weight based on the matrix compound. When the amount of the crosslinker is too low, the solubility of the light-unexposed portion of the photosensitive layer in an alkali aqueous solution cannot be sufficiently reduced. On the other hand, when the crosslinker is contained in excess, a significant effect cannot be obtained; rather, there may arise an inconvenience that the crosslinker cannot be incorporated into the matrix compound, and is separated from the matrix compound in a film, to fail to form a smooth amorphous film.

If the compound of the general formula (BN) wherein hydrogen atoms are introduced into all $R^2$s is used as a matrix compound, and 2,6-bis(hydroxymethyl)-4-methylphenol is incorporated as a crosslinker, then the crosslinker is contained preferably in an amount of 20 to 40% by weight based on the matrix compound.

Both the positive- and negative-type photosensitive compositions in the embodiments can be compounded if necessary with various additives. For example, for reducing the influence of a basic compound (quencher) in the environment, that is, a disadvantage of a chemically amplified resist, a very small amount of a basic compound may be added.

The basic compound includes, for example, a pyridine derivative, an aniline derivative, an amine compound and an indene derivative. The pyridine derivative includes, for example, t-butyl pyridine, benzyl pyridine, and various kinds of pyridinium salts, and the aniline derivative includes, for example, N-methyl aniline, N-ethyl aniline and N,N'-dimethyl aniline. The amine compound includes, for example, diphenylamine and N-methyldiphenylamine.

The amount of the basic compound added is generally 10 to 70 mol % based on the number of moles of the photo-acid generator. When the amount of the basic compound added is too low, its effect cannot be sufficiently obtained. When the amount of the basic compound is too high, the sensitivity of the photosensitive composition may be decreased. The amount of the basic compound added is desirably regulated suitably depending on a patterning apparatus etc. used.

The photosensitive composition in the embodiment can be prepared by dissolving the above-mentioned components in a solvent and filtering the resulting solution through a membrane filter or the like. The solvent includes organic solvents such as ketone, cellosolve and ester. Specifically, the ketone includes, for example, cyclohexanone, acetone, ethyl methyl ketone, and methyl isobutyl ketone. The cellosolve includes, for example, methyl cellosolve, methyl cellosolve acetate, ethyl cellosolve acetate, and butyl cellosolve acetate. The ester includes, for example, ethyl acetate, butyl acetate, isoamyl acetate, γ-butyrolactone and methyl 3-methoxypropionate. These solvents may be used if necessary as a mixture of two or more thereof.

For improving solubility, dimethyl sulfoxide, N,N-dimethylformamide, N-methylpyrrolidinone, anisole, monochlorobenzene or o-dichlorobenene may be used as a part of the solvent, depending on the type of the photosensitive composition. Further, lactates such as ethyl lactate, and propylene glycol monoethyl acetate, and the like, may be used as low-toxic solvents.

When the photosensitive composition in the embodiment is used to form a pattern, the photosensitive composition is first applied onto a substrate to form a photosensitive layer. An arbitrary substrate may be used as the substrate. Specific examples of the substrate include silicon wafers, doped silicon wafers, silicon wafers having various insulating films, electrodes or wirings formed thereon, mask blanks, and semiconductor wafers of compounds in the III-V group, such as GaAs and AlGaAs. Chrome- or chrome oxide-vapor deposited substrates, aluminum-vapor deposited substrates, IBSPG-coated substrates, SOG-coated substrates and SiN-coated substrates may also be used.

For applying the photosensitive composition onto such substrates, an arbitrary method may be used, and examples of such method include spin coating, dip coating, a doctor blade method, and curtain coating.

The photosensitive composition thus applied is dried by heating to form a photosensitive layer. The acid-leaving group in the matrix compound, and the photo-acid generator even in a state unexposed to light, will react and undergo decomposition reaction upon heating at high temperatures, and therefore, the temperature in drying by heating is preferably 170° C. or less, more preferably 70 to 120° C.

Then, a predetermined region of the photosensitive layer is subjected to pattern exposure by irradiation with actinic radiation. This exposure can be carried out by irradiating the photosensitive layer, via a predetermined mask pattern, with actinic radiation. Alternatively, the photosensitive layer may be exposed to light by scanning an ionizing radiation on the photosensitive layer directly without using a mask pattern.

The type of ionizing radiation used in exposure is arbitrary, as long as it has a wavelength at which the photosensitive composition is sensitized. Specific examples of the ionizing radiation used include an ultraviolet light, the i-line, h-line or g-line of a mercury lamp, a xenon lamp light, a deep ultraviolet light (for example an excimer laser light such as KrF or ArF light), an X-ray, a synchrotron orbital radiation (SR), an electron beam, a γ-ray, and an ion beam.

After exposure, the substrate is subjected to a heating treatment (baking treatment). The heating treatment can be conducted using an arbitrary method, generally by heating on a hot plate or in a heating oven or by heating with irradiation of infrared light. In forming a pattern by the chemically amplified resist composition, the heating treatment is conducted for promoting the acid catalytic reaction, but the temperature in the heating treatment is desirably 150° C. or less in order to prevent excessive diffusion of an acid.

Then, the photosensitive layer is developed with an alkali developing solution. The alkali developing solution may be either an organic or inorganic alkali aqueous solution. The organic alkali aqueous solution includes, for example, an aqueous solution of tetramethyl ammonium hydroxide, an aqueous solution of tetraethyl ammonium hydroxide, and an aqueous solution of choline, and the inorganic alkali aqueous solution includes, for example, an aqueous solution of potassium hydroxide and an aqueous solution of sodium hydroxide.

The concentration of the alkali developing solution is not limited, but is preferably 15 mol % or less in order to increase a difference in dissolution rate between the light-exposed portion and light-unexposed portion of the photosensitive layer thereby securing sufficient dissolution contrast. The concentration should be regulated depending on the amount of protective groups introduced into the matrix compound.

An aqueous developing solution at pH 11 or less may also be used as the alkali developing solution. Arbitrary additives may also be added if necessary to the developing solution. For example, a surfactant may be added to reduce the surface tension of the developing solution, and a neutral salt may be added to activate the development. The temperature of the developing solution is arbitrary, and both cold water and hot water may be used.

The method for forming a pattern in the embodiments may include additional steps as necessary. For example, the steps described above may be combined with a step of forming a planarizing layer before arranging the photosensitive layer by coating on a substrate, a step of forming an antireflective layer for reducing the reflection of exposure light, a step of rinsing, with water, etc., the substrate after development treatment, to remove a developing solution, etc., and a step of re-irradiating UV light before dry etching.

As described above, the positive tone photosensitive composition forms a resist pattern by selectively removing the light-exposed portion of the photosensitive layer by dissolution in development treatment. The negative type photosensitive composition forms a resist pattern by selectively removing the light-unexposed portion by dissolution since the light-exposed portion of the photosensitive layer has been crosslinked. Because the photosensitive composition in the embodiments is used, the method in the embodiments can, with high resolution and sensitivity, form a pattern with reduced edge roughness.

Hereinafter, examples will be described.

Synthesis Example 1

Commercially available 1,3,5-tris(p-bromophenyl) benzene (5.43 g), 4-(methoxypheny) boric acid (6.08 g) and potassium carbonate (5.53 g) were introduced into a three-neck flask, and the atmosphere in the flask was replaced by argon. 100 ml dehydrated toluene was added thereto, and the mixture was stirred sufficiently followed by adding tetrakis (triphenylphosphine) palladium (0.2 g). The resulting mixture was stirred at 90° C. for 8 hours.

Upon cooling to room temperature, gray-white precipitates were generated. These precipitates were filtered off, then dissolved in a large amount of toluene, stirred at 100° C. and subjected to hot filtration to produce a filtrate. The solvent was removed from the filtrate by an evaporator, whereby slightly grayish white residues were obtained.

The residues were recrystallized from toluene, and the resulting crystals were filtered under suction and dried at 60° C. under vacuum to give a pure white product (3.15 g; yield 50.4%). As a result of $^1$H-NMR measurement, the white product was identified as (1,3,5-tris(p-(p-methoxyphenyl) phenyl) benzene (abbreviated hereinafter as TMTPPB)) represented by the chemical formula:

(Synthesis Example 2)

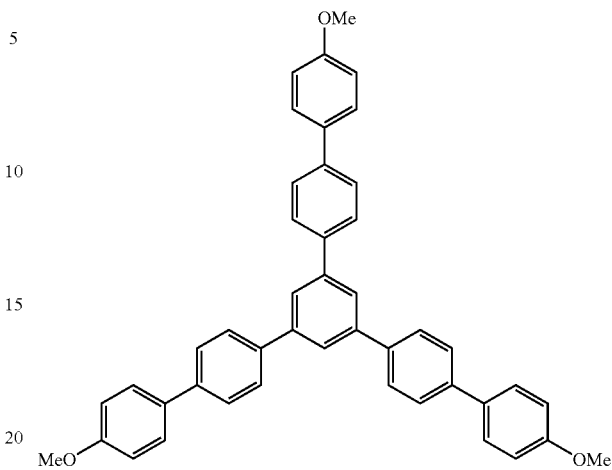

The TMTPPB (2 g) obtained in Synthesis Example 1 above was introduced into a three-neck flask, and the atmosphere in the flask was replaced by argon. Dehydrated dichloromethane (120 ml) was added thereto and stirred to dissolve the substrate. Then, 1 M tribromoboron solution in dichloromethane (22.4 ml) was dropped little by little, and the mixture was stirred at 40° C. for 8 hours. Thereafter, the reaction solution was cooled to room temperature, and 75 ml purified water was added little by little, and the mixture was stirred for 1 to 2 hours.

The reaction solution was extracted 3 times with ethyl acetate to give an organic layer, and this organic layer was dried over sodium sulfate anhydride. After drying, the organic layer was filtered to remove the sodium sulfate anhydride and then evaporated to dryness in an evaporator to give solids. The resulting solids were washed with a small amount of cold methanol, filtered under suction and dried at 60° C. to give a pure product (1.11 g; yield 59.4%).

As a result of $^1$H-NMR measurement, the product was identified as (1,3,5-tris(p-(p-hydroxyphenyl) phenyl) benzene (abbreviated hereinafter as THTPPB)) represented by the following chemical formula. In analysis by TG/DTA and DSC measurement, the glass transition point ($T_g$) was 145° C., and the melting point ($T_m$) was 240° C.

(Synthesis Example 3)

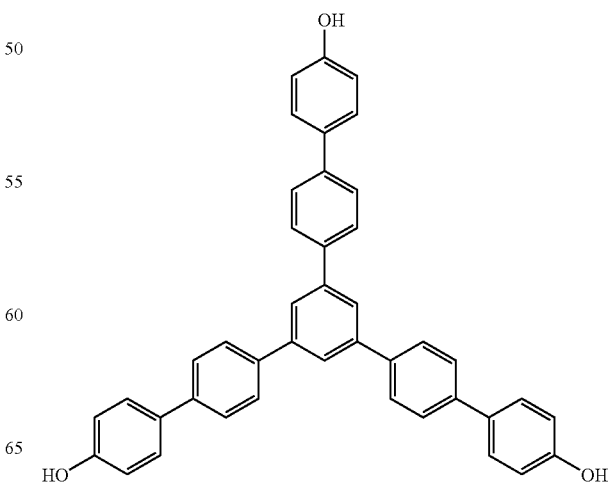

The THTPPB (0.20 g) obtained in Synthesis Example 2 above was introduced into a three-neck flask, and the atmosphere in the flask was replaced by argon. Then, THF was added to dissolve the sample, and then $K_2CO_3$, 18-crown-6, and di-tert-butyl carbonate were added thereto dropwise in this order by using syringe while stirring. The mixture was stirred at 40° C. for 8 hours.

Then, distilled water was added in excess to the reaction solution which was then extracted 3 times with ethyl acetate. The ethyl acetate layer was concentrated and recrystallized from a mixed solvent of tetrahydroxyfuran/methanol to give a white powder (0.26 g; yield 85.5%).

As a result of $^1$H-NMR measurement, the white powder was identified as 1,3,5-tris(p-(p-tert-butoxycarbonyloxyphenyl)phenyl)benzene (abbreviated hereinafter as TBOTPPB)) represented by the following chemical formula:

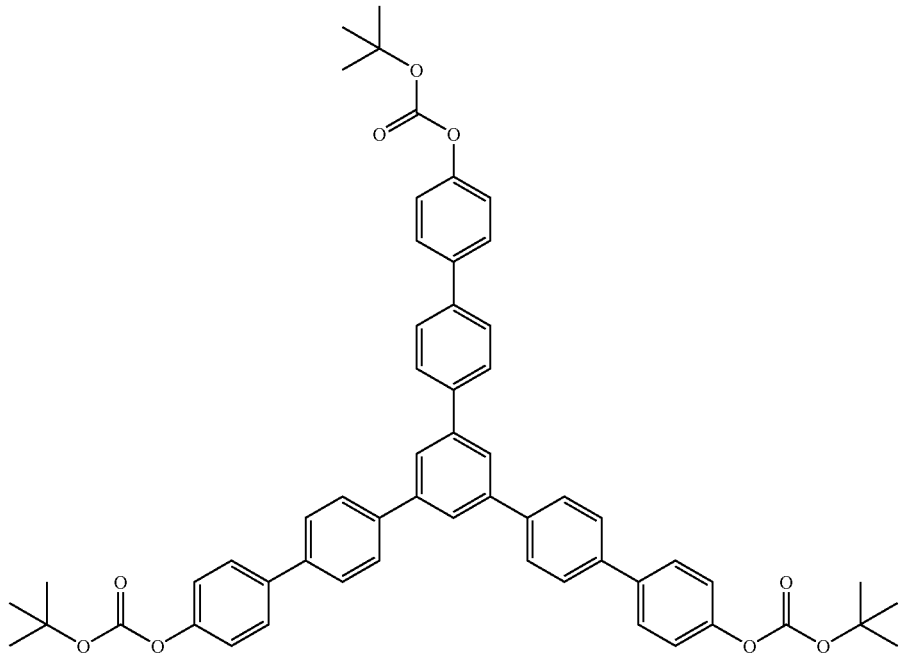

(Synthesis Example 4)

The THTPPB (0.20 g) obtained in Synthesis Example 2 above was introduced into a three-neck flask, and the atmosphere in the flask was replaced by argon. Dimethylformamide was added to dissolve the sample, and the solution was kept at 60° C. Di-tert-butyl carbonate was added thereto, then the mixture was sufficiently stirred, and triethylamine was added dropwise thereto, followed by stirring for 7 hours.

Then, distilled water was added in excess to the reaction solution which was then extracted 3 times with ethyl acetate. The resultant ethyl acetate solution was concentrated and recrystallized from methanol to give a white powder (yield 0.23 g).

As a result of $^1$H-NMR measurement, the white powder was identified as (partially protected tris(p-(p-tert-butoxycarbonyloxyphenyl)phenyl)benzene (abbreviated hereinafter as Semi-TBOTPPB)) represented by the following chemical formula. In analysis by $^1$H-NMR measurement, the ratio of protection of all hydroxy groups was 63.6%.

(Synthesis Example 5)

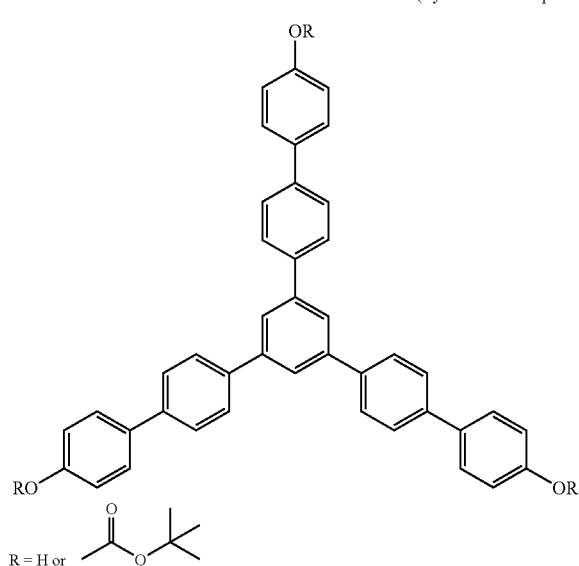

R = H or 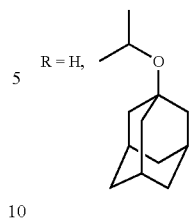

The THTPPB (0.20 g) obtained in Synthesis Example 2 above was introduced into a flask, and ethyl acetate (3.0 g) was added to dissolve the sample. Adamantyl vinyl ether (0.69 g) was added thereto, then the mixture was sufficiently stirred, dichloroacetic acid (0.014 g) was added dropwise thereto, and the mixture was stirred for 1 day.

The reaction mixture was added to 0.5% aqueous sodium hydroxide solution (6.0 g) and extracted 3 times with ethyl acetate. The resultant ethyl acetate solution was washed several times with purified water, concentrated, and precipitated with hexane. The precipitates were recovered and dried to give a white powder (yield 0.21 g).

As a result of $^1$H-NMR measurement, the white powder was identified as (partially protected tris(p-(p-adamantyloxy-ethyloxyphenyl) phenyl) benzene (abbreviated hereinafter as AVE-TPPB)) represented by the following chemical formula. In analysis by $^1$H-NMR measurement, the ratio of protection of all hydroxy groups was 45.9%.

(Synthesis Example 6)

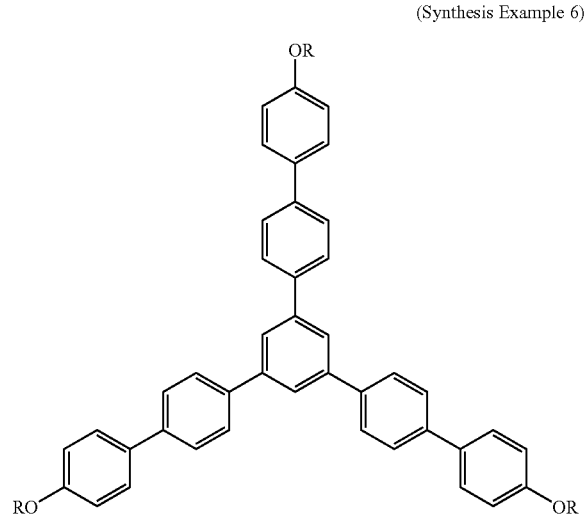

-continued

R = H,

The THTPPB (0.20 g) obtained in Synthesis Example 2 above was introduced into a flask, and ethyl acetate (3.0 g) was added to dissolve the sample. Hyperlactylvinyl ether (0.21 g) was added thereto, then the mixture was sufficiently stirred, dichloroacetic acid (0.014 g) was added dropwise thereto, and the mixture was stirred for 1 day.

The reaction mixture was added to 0.5% aqueous sodium hydroxide solution (6.0 g) and extracted 3 times with ethyl acetate. The resultant ethyl acetate solution was washed several times with purified water, concentrated, and precipitated with hexane. The precipitates were recovered and dried to give a white powder (yield 0.24 g).

As a result of $^1$H-NMR measurement, the white powder was identified as (partially protected tris(p-(p-hyperlactyl-ethyloxyphenyl) phenyl) benzene (abbreviated hereinafter as HPVETPPB)) represented by the following chemical formula. In analysis by $^1$H-NMR measurement, the ratio of protection of all hydroxy groups was 28.3%.

(Synthesis Example 7)

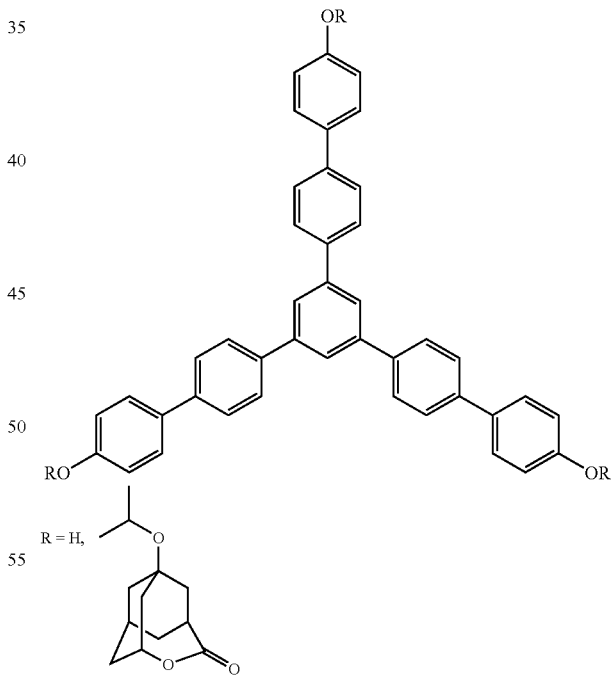

The THTPPB (0.20 g) obtained in Synthesis Example 2 above was introduced into a flask, and ethyl acetate (3.0 g) was added to dissolve the sample. Adamantyl methyl vinyl ether (0.20 g) was added thereto, then the mixture was sufficiently stirred, dichloroacetic acid (0.014 g) was added dropwise thereto, and the mixture was stirred for 1 day.

The reaction mixture was added to 0.5% aqueous sodium hydroxide solution (6.0 g) and extracted 3 times with ethyl acetate. The resultant ethyl acetate solution was washed several times with purified water, concentrated, and precipitated with hexane. The precipitates were recovered and dried to give a white powder (yield 0.23 g).

As a result of $^1$H-NMR measurement, the white powder was identified as (partially protected tris(p-(p-adamantyl-methoxyethyloxyphenyl) phenyl) benzene (abbreviated hereinafter as AMVETPPB)) represented by the following chemical formula. In analysis by $^1$H-NMR measurement, the ratio of protection of all hydroxy groups was 9.7%.

(Synthesis Example 8)

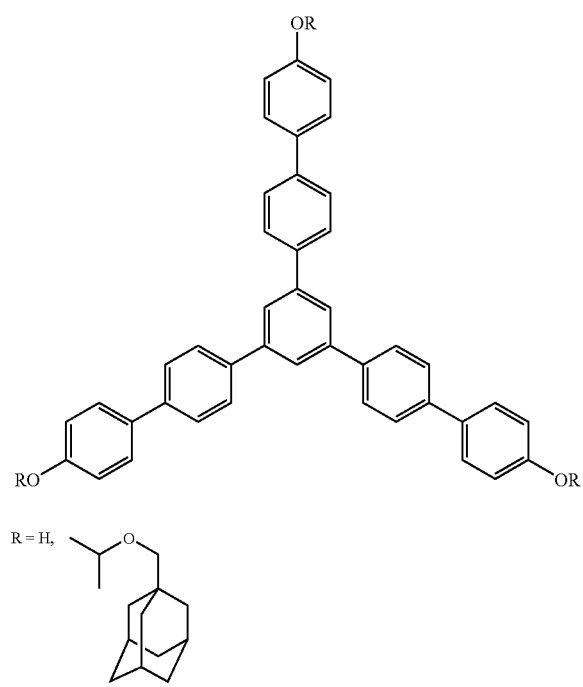

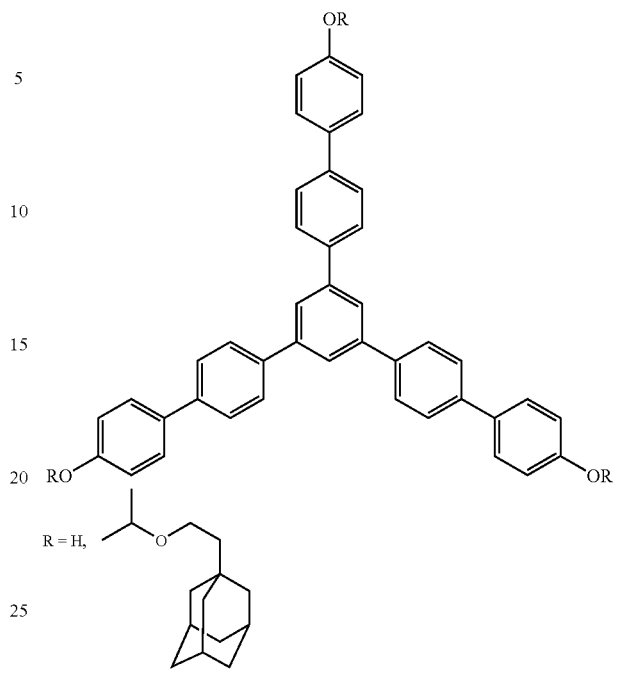

The THTPPB (0.20 g) obtained in Synthesis Example 2 above was introduced into a flask, and ethyl acetate (3.0 g) was added to dissolve the sample. Adamantyl ethyl vinyl ether (0.21 g) was added thereto, then the mixture was sufficiently stirred, dichloroacetic acid (0.014 g) was added dropwise thereto, and the mixture was stirred for 1 day.

The reaction mixture was added to 0.5% aqueous sodium hydroxide solution (6.0 g) and extracted 3 times with ethyl acetate. The resultant ethyl acetate solution was washed several times with purified water, concentrated, and precipitated with hexane. The precipitates were recovered and dried to give a white powder (yield 0.22 g).

As a result of $^1$H-NMR measurement, the white powder was identified as (partially protected tris(p-(p-adamantylethoxyethyloxyphenyl) phenyl) benzene (abbreviated hereinafter as AEVETPPB)) represented by the following chemical formula. In analysis by $^1$H-NMR measurement, the ratio of protection of all hydroxy groups was 21.7%.

The compounds each composed of 7 benzene rings were synthesized in the manner described above. Each compound was dissolved in methyl methoxypropionate as a solvent and then compounded with a photo-acid generator and a basic compound to prepare a resist solution. Triphenylsulfonium triflate was used as the photo-acid generator, and tributyl amine was used as the basic compound.

A formulation of each resist solution is shown in Table 1 below. The amount of the matrix compound incorporated is shown in round brackets in the table. In the Examples that follow, the amount of the matrix compound incorporated is expressed in % by weight based on the solvent, and the amount of the photo-acid generator incorporated is expressed in % by weight based on the matrix compound. The amount of the basic compound incorporated is expressed in mol % based on the photo-acid generator.

TABLE 1

| Resist solution | Matrix compound | Photo-acid generator | Basic compound |
|---|---|---|---|
| 1 | TBOTPPB (10) | 1 | 0 |
| 2 | Semi-TBOTPPB (10) | 1 | 0 |
| 3 | Semi-TBOTPPB (10) | 1 | 5 |
| 4 | Semi-TBOTPPB (10) | 1 | 10 |
| 5 | Semi-TBOTPPB (10) | 1 | 15 |
| 6 | AVETPPB (10) | 1 | 5 |
| 7 | HPVETPPB (10) | 1 | 5 |
| 8 | AMVETPPB (10) | 1 | 5 |
| 9 | AEVETPPB (10) | 1 | 5 |

Example 1 to 9

Each of the resist solutions prepared as described above was used to form a resist film which was then subjected to patterning. Specifically, the resist solution was applied by spin coating onto a silicon wafer to form a resist film of about 200 nm in film thickness. The resulting resist film was baked at 110° C. for 90 seconds and then subjected to pattern exposure with a KrF excimer laser stepper.

After exposure, the resist film was subjected to a baking treatment depending on necessity and then developed with an aqueous solution of tetramethyl ammonium hydroxide (TMAH) to give a positive tone pattern. The treatment conditions and the results are summarized in Table 2 below. In Example 1 where the wholly protected matrix compound was used, the resulting pattern was peeled, while when the partially protected matrix compounds in the other examples were used, the resulting patterns were not peeled.

TABLE 2

| Example | Resist solution | Post-exposure baking (temperature/time) | Development (concentration/time) | Sensitivity (mJ/cm$^2$) | Resolution (μm) |
|---|---|---|---|---|---|
| 1 | 1 | 110° C./90 sec | 2.38%/30 sec | 2.0 | 0.3 (with peel) |
| 2 | 2 | 90° C./90 sec | 2.38%/30 sec | 8.0 | 0.3 |
| 3 | 3 | 90° C./90 sec | 2.38%/30 sec | 8.0 | 0.3 |
| 4 | 4 | 90° C./90 sec | 2.38%/30 sec | 12.0 | 0.3 |
| 5 | 5 | 90° C./90 sec | 2.38%/30 sec | 14.5 | 0.3 |
| 6 | 6 | 90° C./90 sec | 2.38%/30 sec | 1.0 | 0.3 |
| 7 | 7 | 90° C./90 sec | 1.19%/30 sec | 1.0 | 0.3 |
| 8 | 8 | 90° C./90 sec | 0.95%/30 sec | 3.6 | 0.3 |
| 9 | 9 | 90° C./90 sec | 1.19%/30 sec | 2.0 | 0.3 |

Using 2,6-bis(hydroxymethyl)-4-methyl phenol as a crosslinker, a resist solution 10 was prepared according to the formulation shown in Table 3. The amount of the crosslinker incorporated is expressed in % by mass based on the solvent. The resist solution 10 thus obtained acts as a negative type resist.

TABLE 3

| Resist solution | Matrix compound | Photo-acid generator | Basic compound | Crosslinker |
|---|---|---|---|---|
| 10 | THTPPB (7) | 1 | 5 | 2.2 |

Example 10

The resist solution 10 was used to form a resist film which was then subjected to patterning. Specifically, the resist solution 10 was applied by spin coating onto a silicon wafer to form a resist film of about 200 nm in film thickness. The resulting resist film was baked at 110° C. for 90 seconds and then subjected to pattern exposure with a KrF excimer laser stepper. After exposure, the resist film was subjected to a baking treatment and then developed with an aqueous solution of tetramethyl ammonium hydroxide (TMAH) to give a negative type pattern. The treatment conditions and the results are summarized in Table 4 below.

TABLE 4

| Example | Resist solution | Post-exposure baking (temperature/time) | Development (concentration/time) | Sensitivity (mJ/cm$^2$) | Resolution (μm) |
|---|---|---|---|---|---|
| 10 | 10 | 110° C./90 sec | 2.38%/30 sec | 7.0 | 0.3 |

As is evident from the results in Tables 2 and 4, pattern formation with alkali development is feasible when the photosensitive compositions in the Examples are used. In consideration of the photosensitization mechanism of the photo-acid generator, it can be easily presumed that the photosensitive composition is also sensitized with EUV light, that is, soft X-ray (13 nm). That is, it is sufficiently possible to apply the photosensitive compositions in the Examples to future EUV lithography as well.

Then, resist solutions were prepared according to the formulations in Table 5 below. Triphenylsulfonium triflate was used as the photo-acid generator, and tributyl amine was used as the basic compound.

TABLE 5

| Resist solution | Matrix compound | Photo-acid generator | Basic compound |
|---|---|---|---|
| 11 | Semi-TBOTPPB (6) | 5 | 0 |
| 12 | Semi-TBOTPPB (6) | 5 | 30 |
| 13 | AVETPPB (6) | 5 | 30 |
| 14 | HPVETPPB (6) | 5 | 30 |
| 15 | AMVETPPB (6) | 5 | 30 |
| 16 | AEVETPPB (6) | 5 | 30 |

Examples 11 to 16

Each of the resist solutions 11 to 16 above was used in an electron-beam lithographic test. Specifically, the resist solution was applied by spin coating onto a silicon wafer to form a resist film of about 100 nm in film thickness. The resulting resist film was baked at 110° C. for 90 seconds and then subjected to patterning lithography with a low-energy electron-beam direct writing system (accelerating voltage of the electron beam: 5 keV).

After exposure, the resist film was subjected to a baking treatment depending on necessity and then developed with an aqueous solution of tetramethyl ammonium hydroxide (TMAH) to give a positive tone pattern. The treatment conditions and the results are summarized in Table 6 below.

TABLE 6

| Example No. | Resist solution | Post-exposure baking (temperature/time) | Development (concentration/time) | Sensitivity (μC/cm²) | Roughness (nm) |
|---|---|---|---|---|---|
| Example 11 | 11 | 90° C./90 sec | 2.38%/30 sec | 1.3 | 7 |
| Example 12 | 12 | 90° C./90 sec | 2.38%/30 sec | 1.8 | 6 |
| Example 13 | 13 | 90° C./90 sec | 2.38%/30 sec | 0.4 | 5 |
| Example 14 | 14 | 90° C./90 sec | 1.19%/30 sec | 0.4 | 4 |
| Example 15 | 15 | 90° C./90 sec | 0.95%/30 sec | 0.4 | 4 |
| Example 16 | 16 | 90° C./90 sec | 1.19%/30 sec | 0.4 | 4 |
| Comparative Example 1 | 7 | 110° C./90 sec | 1.19%/30 sec | 5.9 | 10 |

Roughness was evaluated by a method of evaluating a line-wise roughness (LWR) in the following manner. The resist film was subjected to electron beam lithography and then to a baking treatment followed by a development treatment with an aqueous solution of TMAH, to give a predetermined line and space (L/S) pattern of 100 nm in line width. The LWR value (3σ value) of the resulting pattern in a region of 350×200 nm (ROI) was calculated.

A 500 nm×500 nm region of the surface thereof was measured with an AFM measuring instrument (Nanoscope III, tapping mode, with a super sharp silicon chip [SSS-NCH-50] used in a cantilever) to evaluate its surface roughness (Ra value) in a 250 nm×250 nm region with analysis software attached to the AFM measuring instrument. The results thus obtained are summarized in Table 8.

TABLE 8

| Example No. | Resist solution | Post-exposure baking (temperature/time) | Development (concentration/time) | Surface roughness (nm) |
|---|---|---|---|---|
| Example 17 | 3 | 90° C./90 sec | 2.38%/30 sec | 1.46 |
| Comparative Example 2 | 18 | 110° C./90 sec | 2.38%/30 sec | 3.10 |

The resist 17 used in Comparative Example 1 in Table 6 above was prepared according to the following formulation using partially tert-butoxycarbonyloxylated polyhydroxystyrene having a molecular weight of 20000 (hereinafter referred to as TBOPHS) as the matrix compound. Triphenylsulfonium triflate was used as the photo-acid generator, and tributyl amine was used as the basic compound.

TABLE 7

| Resist solution | Matrix compound | Photo-acid generator | Basic compound |
|---|---|---|---|
| 17 | TBOPHS (6) | 5 | 30 |

As is evident from the results in Table 6 above, the photosensitive compositions in the embodiments can be developed with an alkali aqueous solution. It can also be seen that a resist pattern with roughness reduced within an allowable range can be formed with high sensitivity, and excellent resolution can be achieved.

Example 17

The resist solution 3 was applied by spin coating onto a silicon wafer to form a resist film of about 200 nm in film thickness. The resulting resist film was baked at 110° C. for 90 seconds, and the whole surface of the film was exposed to ultraviolet light, subjected to a baking treatment and developed with 2.38% tetramethyl ammonium hydroxide (TMAH) aqueous solution to give a film having a residual film at a constant ratio of 50%.

The resist 18 used in Comparative Example 2 in Table 8 above was prepared according to the following formulation using the above-mentioned TBOPHS as the matrix compound. Triphenylsulfonium triflate was used as the photo-acid generator, and tributyl amine was used as the basic compound.

TABLE 9

| Resist solution | Matrix compound | Photo-acid generator | Basic compound |
|---|---|---|---|
| 18 | TBOPHS (10) | 1 | 5 |

From the results in Table 8 above, it is evident that when the photosensitive composition in the embodiments is used, surface roughness can be reduced. Because the surface roughness is regarded as corresponding to edge roughness, it can be confirmed again that roughness is made small by using the photosensitive composition in the embodiments. In consideration of the photosensitization mechanism of the photo-acid generator, it can be easily presumed that roughness is also small with the photosensitive composition upon sensitization with EUV light i.e. soft X-ray (13 nm).

As described above, the photosensitive compositions in the embodiments can be used to form resist patterns with reduced roughness, even in future EUV lithography, and the industrial value thereof is enormous.

According to the embodiments of the invention, there can be provided a photosensitive composition developable with an alkali and having high resolution and reduced edge roughness by ultrasensitive reaction upon irradiation with actinic radiation.

What is claimed is:

1. A photosensitive composition comprising:
a compound represented by formula BP;

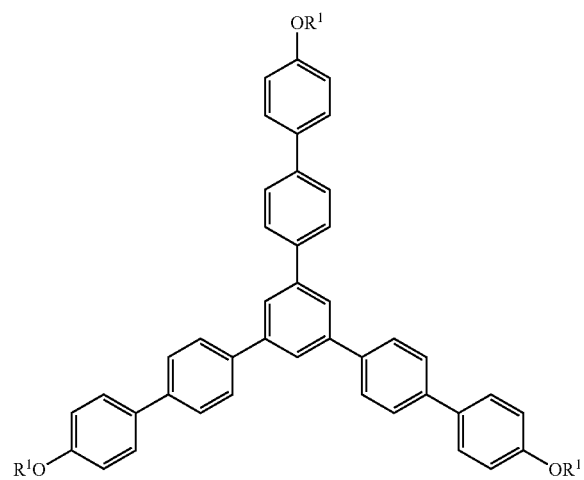

formula BP wherein R¹ is an acid-leaving group, and a part of R¹ may be substituted with a hydrogen atom; and
a photo-acid generator which generates an acid by an action of actinic radiation.

2. The photosensitive composition according to claim 1, wherein the acid-leaving group is selected from the group consisting of an ether, an ester, an alkoxy carbonate, a silyl ether, an acetal, a ketal, a cyclic orthoester, a silylketene acetal, a cyclic acetal, a cyclic ketal and a cyanohydrin.

3. The photosensitive composition according to claim 2, wherein the acid-leaving group contains an alicyclic structure.

4. The photosensitive composition according to claim 3, wherein the alicyclic structure is selected from adamantane and hyperlacton.

5. The photosensitive composition according to claim 4, wherein the acid-leaving group is selected from the following group consisting of:

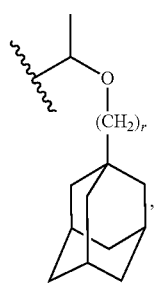

AC-1

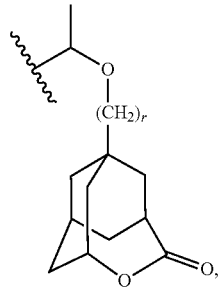

AC-2

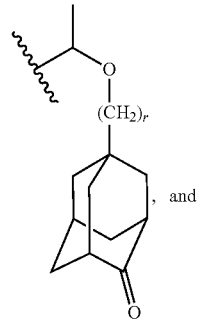

AC-3

, and

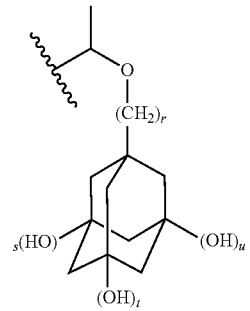

AC-4 wherein r is an integer of 0 to 5, and s, t and u may be the same or different and each represent an integer of 0 or 1 provided that the total of s, t and u is an integer of 1 to 3.

6. The photosensitive composition according to claim 5, wherein the acid-leaving group is selected from the following group consisting of:

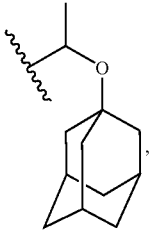

AC-5

-continued

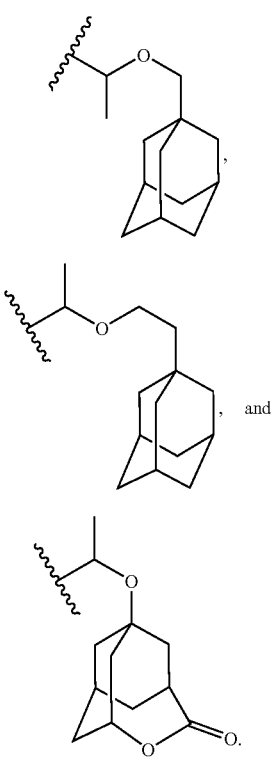

AC-6

AC-7

AC-8

7. The photosensitive composition according to claim 6, wherein the acid-leaving group is AC-5, AC-6 or AC-7, and 60 to 95% of the above-mentioned $R^1$ is hydrogen atoms.

8. The photosensitive composition according to claim 6, wherein the acid-leaving group is AC-8, and 20 to 80% of the above-mentioned $R^1$ is hydrogen atoms.

9. The photosensitive composition according to claim 1, further comprising a basic compound.

10. A photosensitive composition comprising:
a compound represented by the formula BN;

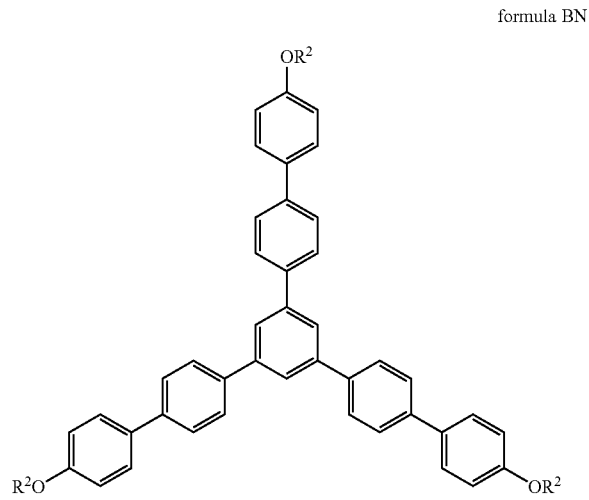

formula BN wherein $R^2$ is a hydrogen atom, and a part of $R^2$ may be substituted with an acid-leaving group;
a photo-acid generator which generates an acid by an action of actinic radiation; and
a crosslinker which reacts with a hydroxy group by a catalytic action of an acid.

11. The photosensitive composition according to claim 10, wherein the acid-leaving group is selected from the group consisting of an ether, an ester, an alkoxy carbonate, a silyl ether, an acetal, a ketal, a cyclic orthoester, a silylketene acetal, a cyclic acetal, a cyclic ketal and a cyanohydrin.

12. The photosensitive composition according to claim 11, wherein the acid-leaving group contains an alicyclic structure.

13. The photosensitive composition according to claim 12, wherein the alicyclic structure is selected from adamantane and hyperlacton.

14. The photosensitive composition according to claim 13, wherein the acid-leaving group is selected from the following group consisting of:

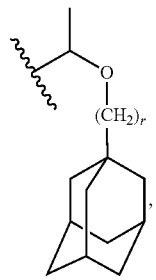

AC-1

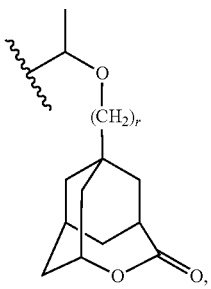

AC-2

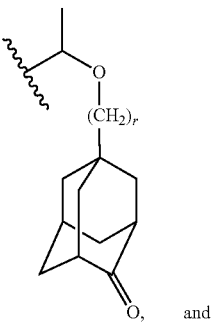

AC-3 and

-continued

AC-4

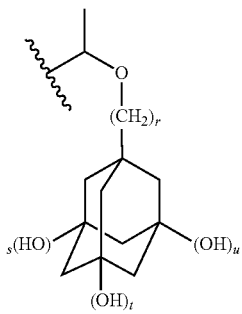

wherein r is an integer of 0 to 5, and s, t and u may be the same or different and each represent an integer of 0 or 1 provided that the total of s, t and u is an integer of 1 to 3.

15. The photosensitive composition according to claim 14, wherein the acid-leaving group is selected from the following group consisting of:

AC-5

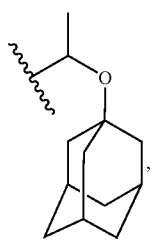

,

AC-6

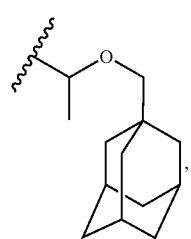

,

AC-7

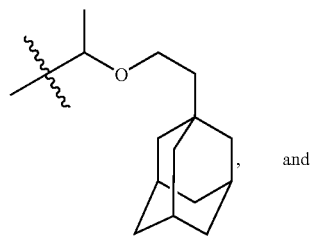 and

-continued

AC-8

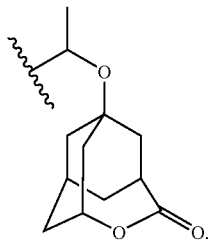

16. The photosensitive composition according to claim 15, wherein the acid-leaving group is AC-5, AC-6 or AC-7, and 80 to 99% of the above-mentioned $R^2$ is hydrogen atoms.

17. The photosensitive composition according to claim 15, wherein the acid-leaving group is AC-8, and 70 to 95% of the above-mentioned $R^2$ is hydrogen atoms.

18. The photosensitive composition according to claim 10, further comprising a basic compound.

19. A method for forming a pattern comprising:

forming a photosensitive layer containing the photosensitive composition of claim 1 above a substrate;

subjecting a predetermined region of the photosensitive layer to pattern exposure by irradiation with actinic radiation;

subjecting the substrate to a baking treatment; and subjecting the photosensitive layer after the baking treatment to a development treatment with an alkali aqueous solution, to selectively remove the light-exposed portion of the photosensitive layer.

20. A method for forming a pattern comprising:

forming a photosensitive layer containing the photosensitive composition of claim 10 above a substrate;

subjecting a predetermined region of the photosensitive layer to pattern exposure by irradiation with actinic radiation;

subjecting the substrate to a baking treatment; and subjecting the photosensitive layer after the baking treatment to a development treatment with an alkali aqueous solution, to selectively remove the light-unexposed portion of the photosensitive layer.

* * * * *